US011177163B2

(12) United States Patent
Motoyama et al.

(10) Patent No.: US 11,177,163 B2
(45) Date of Patent: Nov. 16, 2021

(54) TOP VIA STRUCTURE WITH ENLARGED CONTACT AREA WITH UPPER METALLIZATION LEVEL

(71) Applicant: International Business Machines Corporation, Armonk, NY (US)

(72) Inventors: Koichi Motoyama, Clifton Park, NY (US); Chanro Park, Clifton Park, NY (US); Kenneth Chun Kuen Cheng, Albany, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/821,373

(22) Filed: Mar. 17, 2020

(65) Prior Publication Data

US 2021/0296164 A1 Sep. 23, 2021

(51) Int. Cl.
*H01L 21/00* (2006.01)
*H01L 21/768* (2006.01)
*H01L 23/522* (2006.01)
*H01L 23/532* (2006.01)

(52) U.S. Cl.
CPC .... *H01L 21/76813* (2013.01); *H01L 21/7688* (2013.01); *H01L 21/76843* (2013.01); *H01L 23/5226* (2013.01); *H01L 23/53242* (2013.01); *H01L 23/53257* (2013.01)

(58) Field of Classification Search
CPC ......... H01L 21/76808; H01L 21/76813; H01L 21/76832; H01L 21/76834; H01L 21/76837; H01L 21/76843; H01L 21/7688; H01L 21/76885; H01L 23/5226; H01L 23/5283; H01L 23/53223; H01L 23/53238; H01L 23/53242; H01L 23/53252; H01L 23/53257; H01L 23/53266; H01L 23/53295
See application file for complete search history.

(56) References Cited

U.S. PATENT DOCUMENTS

| | | | |
|---|---|---|---|
| 6,352,916 B1 * | 3/2002 | Tang | H01L 23/485 |
| | | | 438/622 |
| 6,900,539 B2 | 5/2005 | Motoyama | |
| 7,033,929 B1 * | 4/2006 | Burke | H01L 21/76808 |
| | | | 257/E21.577 |
| 7,262,122 B2 * | 8/2007 | Kim | H01L 21/31111 |
| | | | 257/E21.251 |

(Continued)

FOREIGN PATENT DOCUMENTS

KR 100827498 B1 5/2008

*Primary Examiner* — Laura M Menz
(74) *Attorney, Agent, or Firm* — Cantor Colburn LLP; L. Jeffrey Kelly

(57) ABSTRACT

Integrated circuits include back end of line metallization levels. An upper metallization level is on a lower metallization level and includes at least one top via-line interconnect structure in an interlayer dielectric. The lower metallization level includes at least one top via-line interconnect structure in an interlayer dielectric, wherein the top via is raised relative to the interlayer dielectric in the lower metallization level. The line in the upper metallization level contacts a top surface and sidewall portions of the top via raised above the interlevel dielectric. Also described are methods for fabricating the same.

7 Claims, 12 Drawing Sheets

(56) References Cited

U.S. PATENT DOCUMENTS

| | | | | |
|---|---|---|---|---|
| 7,312,532 | B2* | 12/2007 | Burke | H01L 21/76808 257/774 |
| 7,470,613 | B2 | 12/2008 | Agarwala et al. | |
| 8,664,766 | B2 | 3/2014 | Yang et al. | |
| 9,087,844 | B2 | 7/2015 | Kim et al. | |
| 9,613,861 | B2* | 4/2017 | Anderson | H01L 23/5226 |
| 9,953,915 | B2 | 4/2018 | Chen et al. | |
| 10,141,224 | B2* | 11/2018 | Hu | H01L 23/49827 |
| 10,460,990 | B2 | 10/2019 | Clevenger et al. | |
| 10,777,452 | B2* | 9/2020 | Ho | H01L 21/76831 |
| 2002/0155693 | A1* | 10/2002 | Hong | H01L 21/76897 438/618 |
| 2003/0075752 | A1* | 4/2003 | Motoyama | H01L 21/76843 257/306 |
| 2005/0112957 | A1* | 5/2005 | Yang | H01L 21/76844 439/758 |
| 2005/0186782 | A1* | 8/2005 | Burke | H01L 21/76808 438/638 |
| 2007/0111510 | A1* | 5/2007 | Agarwala | H01L 23/5283 438/622 |
| 2007/0202689 | A1* | 8/2007 | Choi | H01L 21/76844 438/637 |
| 2008/0064221 | A1* | 3/2008 | Han | H01L 21/7684 438/706 |
| 2009/0206485 | A1* | 8/2009 | Yang | H01L 23/5226 257/751 |
| 2012/0068346 | A1* | 3/2012 | Ponoth | H01L 23/5283 257/773 |
| 2013/0082393 | A1* | 4/2013 | Kawamura | H01L 21/28568 257/773 |
| 2014/0048927 | A1* | 2/2014 | Burke | H01L 23/5283 257/737 |
| 2014/0061917 | A1* | 3/2014 | Kim | H01L 21/76816 257/751 |
| 2015/0056800 | A1* | 2/2015 | Mebarki | H01L 21/32139 438/652 |
| 2017/0084534 | A1* | 3/2017 | Chen | H01L 23/53295 |
| 2018/0061707 | A1* | 3/2018 | Clevenger | H01L 21/76831 |
| 2018/0123038 | A1* | 5/2018 | Lee | H01L 45/06 |
| 2019/0080960 | A1* | 3/2019 | Ho | H01L 21/76831 |
| 2020/0035605 | A1* | 1/2020 | Tsai | H01L 23/485 |
| 2020/0144195 | A1* | 5/2020 | Yang | H01L 21/7684 |
| 2021/0013096 | A1* | 1/2021 | Ho | H01L 21/76831 |
| 2021/0043507 | A1* | 2/2021 | Motoyama | H01L 21/76852 |
| 2021/0134664 | A1* | 5/2021 | Motoyama | H01L 23/5226 |
| 2021/0249302 | A1* | 8/2021 | Anderson | H01L 21/76816 |

* cited by examiner

TOP VIA STRUCTURE WITH ENLARGED CONTACT AREA WITH UPPER METALLIZATION LEVEL

BACKGROUND

The present invention generally relates to semiconductor integrated circuits and a method of fabrication thereof, and more specifically, to back end of line interconnect structures and methods to form fully aligned top via-line interconnect structures having an enlarged contact area with an upper metallization level.

Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact formation. Layers of interconnections are formed above these logical and functional layers during the BEOL processing to complete the integrated circuit structure. As such, BEOL processing generally involves the formation of insulators and conductive wiring. The industry has typically used copper as the conductive metal for the interconnect structures most often using a dual damascene process to form a metal line/via interconnect structure.

SUMMARY

Embodiments of the present invention are generally directed to integrated circuits including interconnect structures formed with alternative metals and methods for fabricating the same. A non-limiting example of an integrated circuit according to aspects of the invention includes an upper metallization level on a lower metallization level. The upper metallization level can include at least one top via-line interconnect structure in an interlayer dielectric. The lower metallization level can include at least one top via-line interconnect structure in an interlayer dielectric. The top via can be raised relative to the interlayer dielectric in the lower metallization level. In some embodiments of the invention, the line in the upper metallization level contacts a top surface and sidewall portions of the top via raised above the interlevel dielectric.

A non-limiting example method for forming an integrated circuit including an interconnect structure formed of an alternative metal according to aspects of the invention includes forming a lower level metallization level having a top via-line interconnect structure in an interlayer dielectric. The interlayer dielectric in the lower metallization level is recessed to provide a raised portion of the top via relative to the interlayer dielectric. An upper level metallization level is formed on the lower metallization level. The upper metallization level can include a top via-line interconnect structure in an interlayer dielectric. The line in the upper metallization level contacts a top surface and sidewalls of the raised portion of the top via in the lower metallization level.

A non-limiting example method for forming an integrated circuit including an interconnect structure formed of an alternative metal according to aspects of the invention includes forming an upper metallization level on a lower metallization level having an enlarged contact area between a line in the upper metallization level and a top via in a lower metallization level. The method further includes providing the lower metallization level such that it includes a planar surface having a top via-line interconnect structure in an interlayer dielectric. The interlayer dielectric is recessed to provide a raised portion of the top via relative to the interlayer dielectric. An etch stop layer can be conformally deposited onto the lower metallization level and the upper metallization level can be formed by depositing a metal layer onto the etch stop layer. Trenches are patterned in the metal layer to the etch stop layer and the trenches are filled with a gap fill material. The method can include subtractively etching the metal layer to pattern vias and define a top via-line interconnect structure. The gap fill material can be removed to expose the etch stop layer and exposed portions of the etch stop layer can be removed. An interlayer dielectric can be deposited to define the upper metallization level on the lower metallization level.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

DETAILED DESCRIPTION

Figure 1:
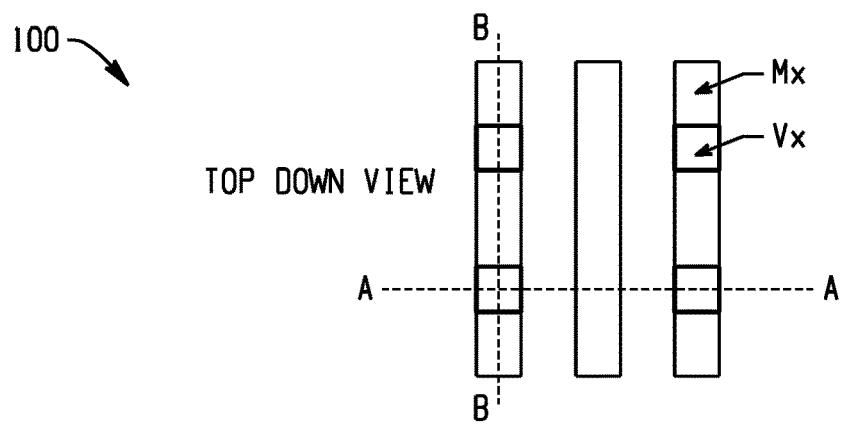
FIG. 1 depicts a top down view of an integrated circuit including cross-sectional views of a back end of the line (BEOL) lower metallization level taken along lines A-A and B-B subsequent to planarization in accordance with one or more embodiments of the present invention.
Figure 1:
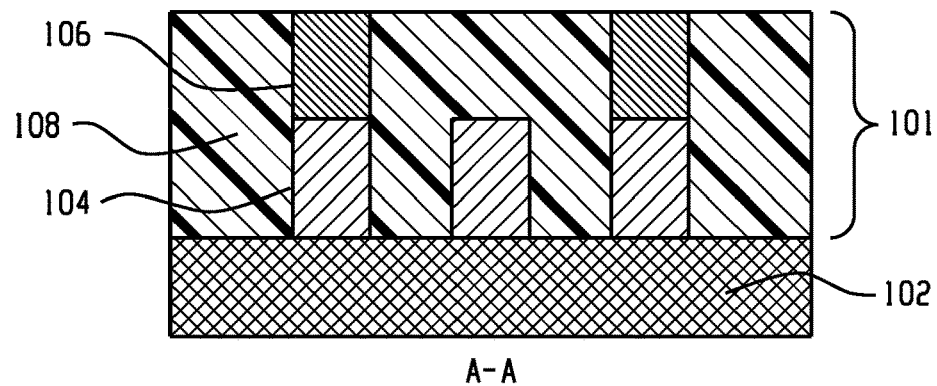
Figure 1:
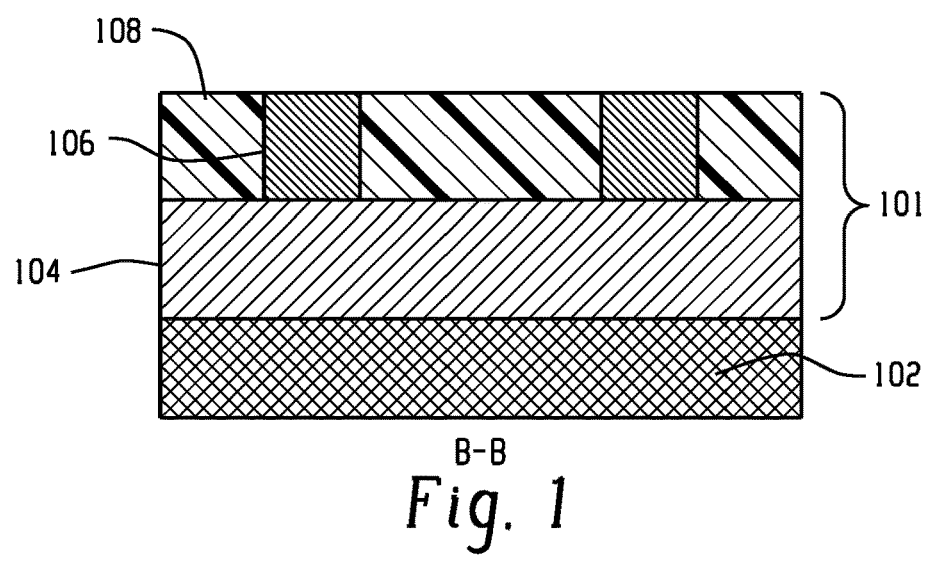

As the critical dimensions increasingly scale downward, the copper wiring scheme becomes more complex, mainly because there are more transistors to connect with at tighter pitches. Shrinking dimensions also means the wires have a reduced cross-sectional area, which drives up the resistance-capacitance product (R/C) of the interconnect system, which results in an undesirable increase in signal delay. For example, for back end of line (BEOL) pitches below 30 nanometers (nm), R/C delay is growing unsustainably large. A top via integration scheme in accordance with one or more aspects of the present invention can be used to reduce the RC delay. As will be described in greater detail below, the top via-line interconnect structure is configured to increase the contact surface area between the top vias in a lower metallization level and the lines in an overlying metallization level.

In the present invention, a top via integration scheme is presented that utilizes subtractive etching to form the top via-line interconnect structure. The lines in the overlaying metallization level are configured to wrap about a raised portion of the top via relative to the interlayer dielectric in the lower metallization level as opposed to simply contacting the top planar surface of the top via in the lower metallization level as was done in prior technology nodes. Moreover, the top via-line interconnect structure in the metallization levels can be formed of a lower resistivity metal such as ruthenium or the like as compared to copper. At interconnect linewidths less than 15 nanometers (nm), for example, resistivity of copper increases due to grain boundary and surface scattering not to mention making it more difficult to prevent electromigration. The use of alternative metal such as ruthenium can provide lower resistivity. Still further, barrier layers for metals such as copper at these scaled dimensions are likely to be on the order of about 1 nm or less. These issues can also be addressed by replacing copper with an alternative metal such as ruthenium to provide increased reliability and lower the line resistance even further.

Detailed embodiments of the integrated circuits including top via-line interconnect structure and methods for fabricating the integrated circuit including the top via-line interconnect structure according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

Turning now to FIG. 1, a top down view of an integrated circuit 100 including cross-sectional views of a back end of the line (BEOL) lower metallization level 101 taken along lines A-A and B-B, e.g., a lower line Mx (referred to herein as the metal line 104) and via level Vx (referred to herein as the metal vias 106), provided on a substrate 102. The lower metallization level 101 is a top down via-line interconnect structure including a metal line 104 and fully aligned metal vias 106 formed within an interlayer dielectric 108. The lower metallization level 101 is depicted subsequent to a planarization process such that the top surface of the interconnect structure is planar. The metal vias 106 include a top surface that is exposed and coplanar to the top surface of the interlayer dielectric 108.

The substrate 102 can include front end of line devices, middle of the line contact or plug structures, or another interconnect structure.

The metal line lines 104 and metal vias 106 can be formed of copper, tungsten, ruthenium, iridium, rhodium, molybdenum, cobalt, aluminum, osmium, combinations thereof, and alloys thereof. Deposition of the metal can be formed by CVD, sputtering, electrochemical deposition or like processes. In one or more embodiments, the metal liens and metal vias can include a liner or barrier layer intermediate the metal and the interlayer dielectric. The liner layer can include tantalum, tantalum nitride, cobalt, ruthenium, titanium, titanium nitride, tungsten nitride, or combinations of more than one material (for example tantalum nitride/tantalum or tantalum nitride/cobalt). The presence of the liner layer such as titanium nitride, for example, ensures that the metal, which can participate in interdiffusion during subsequent annealing processes, will not further diffuse into interlayer dielectric 108. Additionally, the liner layer (not shown) can provide increased adhesion of the alternative metal to the liner layer. The liner layer can be deposited by PVD, CVD, or ALD processes.

Additionally, in one or more embodiments, the lower metallization level 101 can include a seed layer deposited on the liner layer for the metal conductor utilized for the metal lines and metal vias. For example, a typical seed layer for copper-plated metal interconnects can include copper, or a copper-ruthenium alloy, a copper-manganese alloy, iridium, an iridium alloy, ruthenium, a ruthenium alloy any other suitable noble metal or noble metal alloy which would selectively promote electroplating of copper or a copper alloy on the seed layer. The seed layer can be deposited using PVD, CVD, or ALD, for example.

The interlayer dielectric 108 can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The interlayer dielectric 108 can be deposited by PECVD procedures as is generally known in the art.

Figure 2:
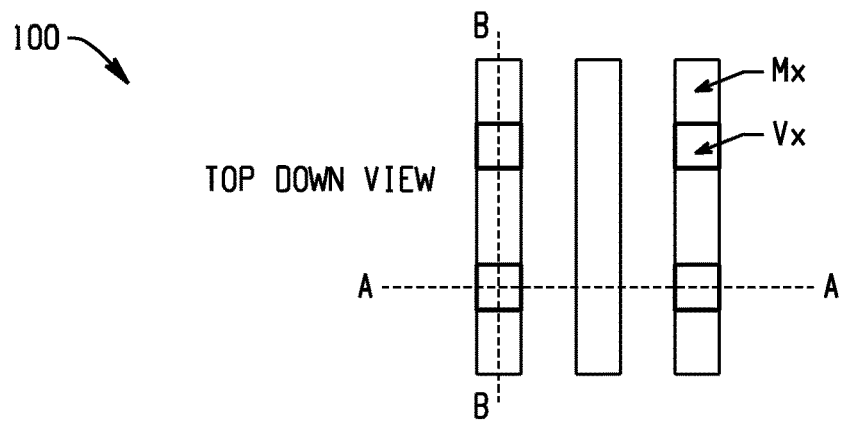
FIG. 2 depicts a top down view and cross-sectional views taken along lines A-A and B-B of the lower metallization level shown in FIG. 1 subsequent to dielectric recess in accordance with one or more embodiments of the present invention.
Figure 2:
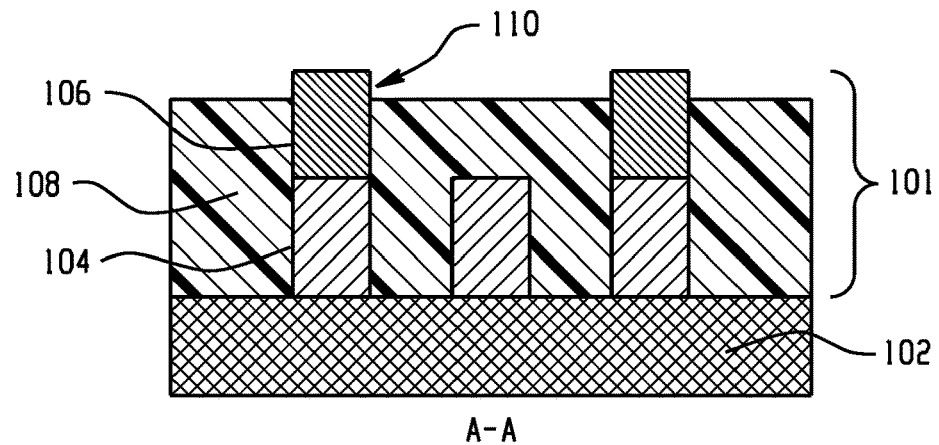
Figure 2:
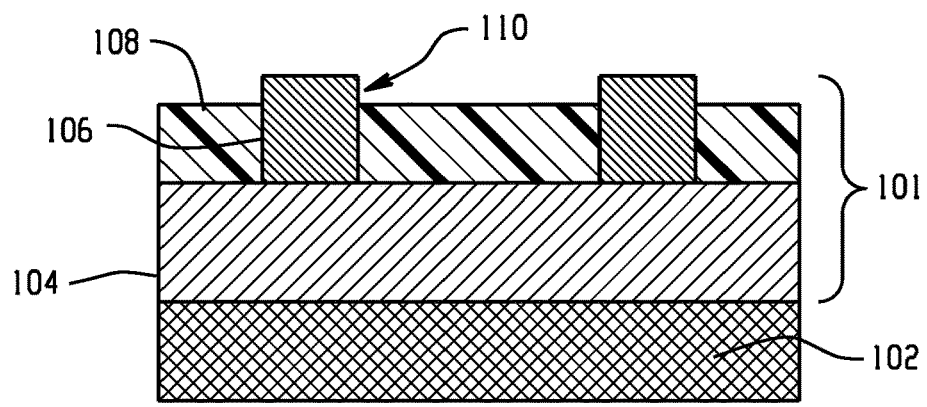

FIG. 2 illustrates top down view and cross-sectional views taken along lines A-A and B-B of the metallization level 101 in integrated circuit 100 shown in FIG. 1 subsequent to recess of the interlayer dielectric 108 so as to expose a sidewall portion 110 of the metal via. The recess can be performed using a wet or dry etch process, which can be timed-based as is known in the art to remove a relatively small portion of the dielectric material. In one or more embodiments, the dielectric material is removed in an amount configured to expose greater than 10 percent to less than about 30 percent of the via height, although greater or less amounts could be used. In one or more other embodiments, the dielectric material is removed in an amount configured to expose greater than about 15% of the via height to less than about 25 percent and in still one or more other embodiments, the dielectric material is removed in an amount configured to expose greater than about 15% to less than about 20% of the via height, wherein the via height is the distance extending from the metal line to the top surface of the metal via.

Figure 3:
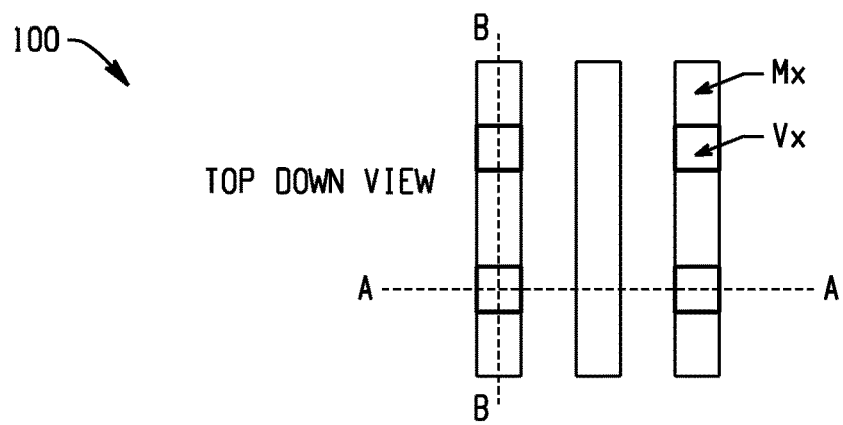
FIG. 3 depicts a top down view and cross-sectional views taken along lines A-A and B-B of the lower metallization level shown in FIG. 2 subsequent to etch stop layer deposition in accordance with one or more embodiments of the present invention.
Figure 3:
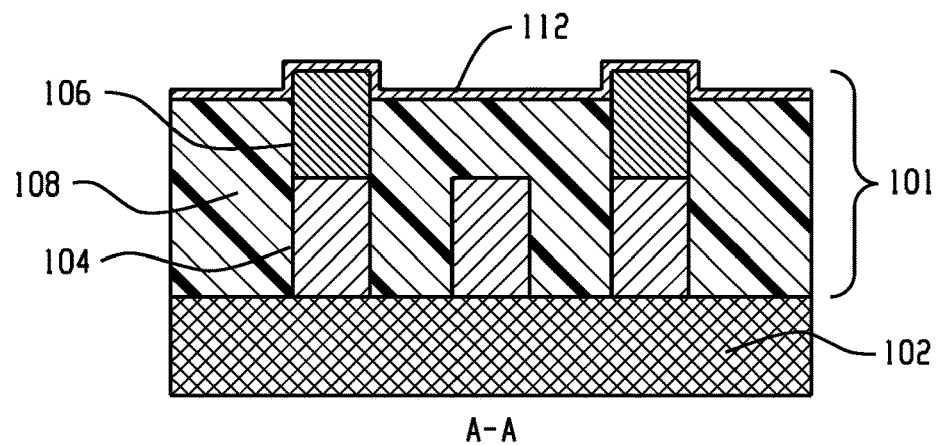
Figure 3:
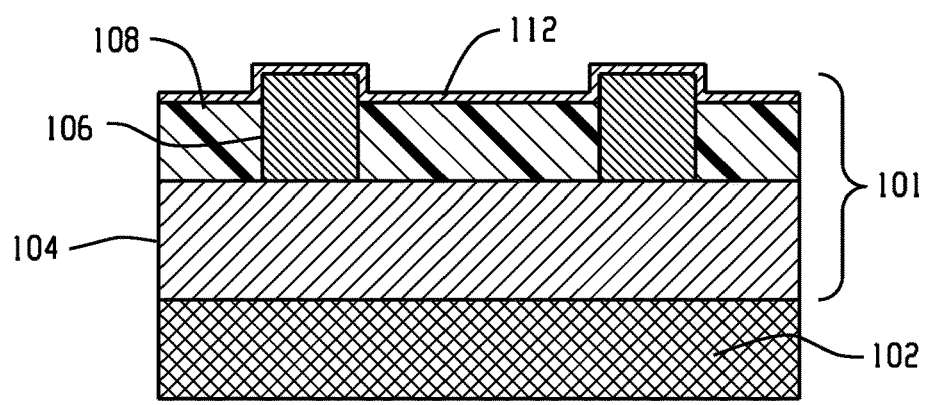

FIG. 3 illustrates top down view and cross-sectional views taken along lines A-A and B-B of the of the metallization level 101 in integrated circuit 100 shown in FIG. 2 subsequent to deposition of a conformal etch stop layer 112. The etch stop layer 112 can be formed from nitrides of titanium, cobalt, tantalum, rhodium, tungsten, iridium, combinations thereof, alloys thereof or the like. The metal etch stop layer can be formed by CVD, ALD, sputtering, electrochemical deposition or like processes.

Figure 4:
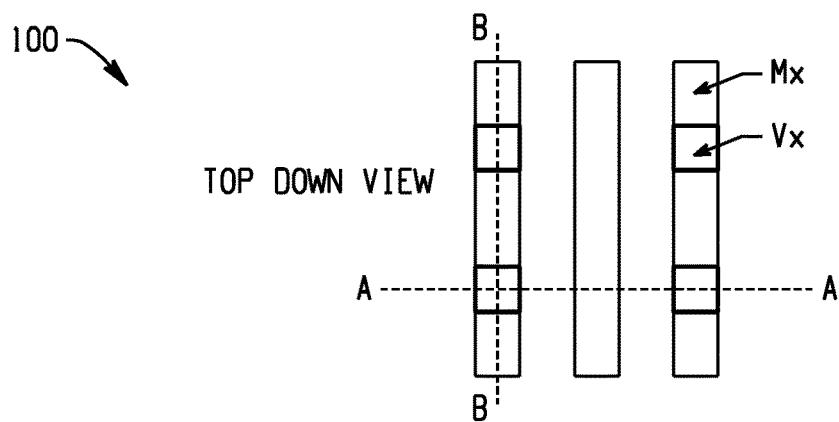
FIG. 4 depicts a top down view and cross-sectional views taken along lines A-A and B-B of the lower metallization level shown in FIG. 3 subsequent to metal deposition on the lower metallization level in accordance with one or more embodiments of the present invention.
Figure 4:
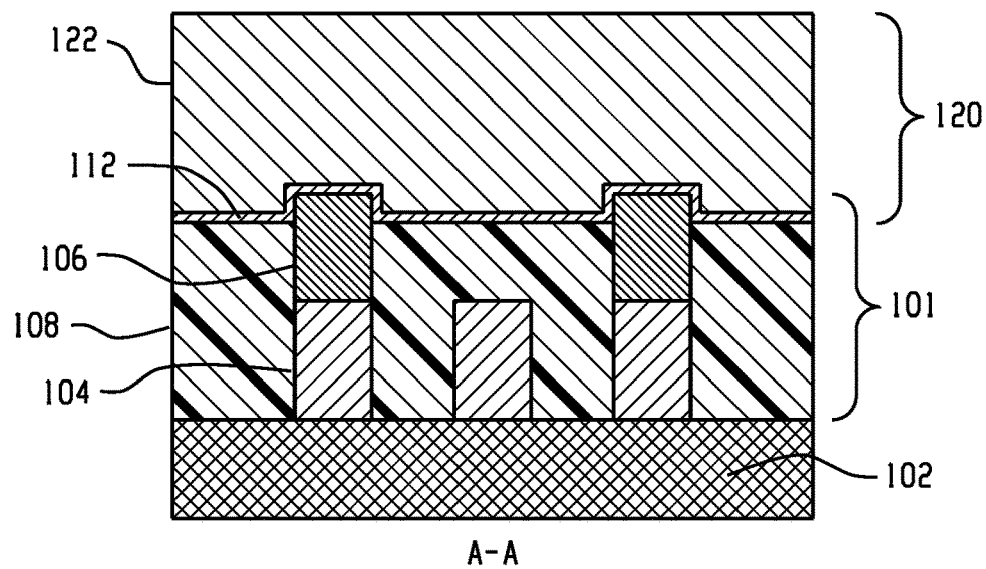
Figure 4:
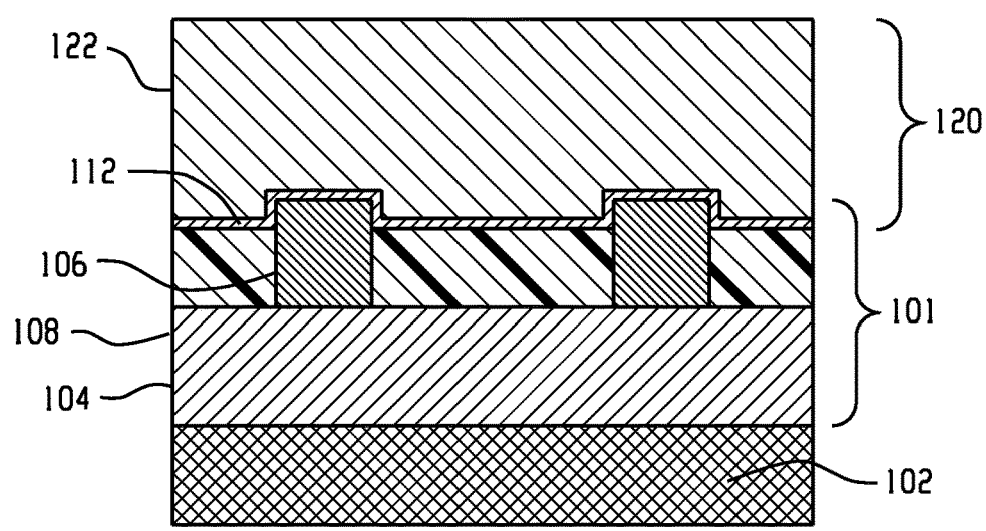

FIG. 4 illustrates top down view and cross-sectional views taken along lines A-A and B-B of the of the metallization level 101 in integrated circuit 100 shown in FIG. 3 subsequent to deposition of a metal layer 122 on the etch stop layer 112 for forming an upper metallization level 120 on the lower metallization level 101. As shown in FIG. 4, the upper metallization level 120 slightly overlaps with the metallization level 101 due to the recess of the interlayer dielectric 108 (as shown in FIG. 2). In other words, a bottommost surface of the upper metallization level 120 is below a topmost surface of the metal vias 106. Conversely, the metal vias 106 can be said to extend into the upper metallization level 120. Advantageously, extending the metal vias 106 into the upper metallization level 120 increases the contact surface area between the metal vias 106 and the metal layer 122, lowering via resistance and improving device performance.

In one or more embodiments, the metal layer 122 can include a single layer as shown having a thickness corresponding to an overall height of the intended metal line and top via overlaying interconnect structure, i.e., the upper metallization level 120 overlaying the lower metallization level 101. In one or more embodiments, the metal layer 122 can include two metal layers having a combined thickness corresponding to an overall height of the intended metal line and top via interconnect structure, wherein one of the metal layer has a thickness corresponding to the top via height and the other metal layer has a thickness corresponding the metal line height. An optional metal etch stop layer can be provided intermediate the upper metal layer and the lower metal layer. In the single layer and dual layer metal stack embodiments discussed above, a hardmask (e.g., SiN) can be provided on a top surface of the metal layer 122.

Figure 5:
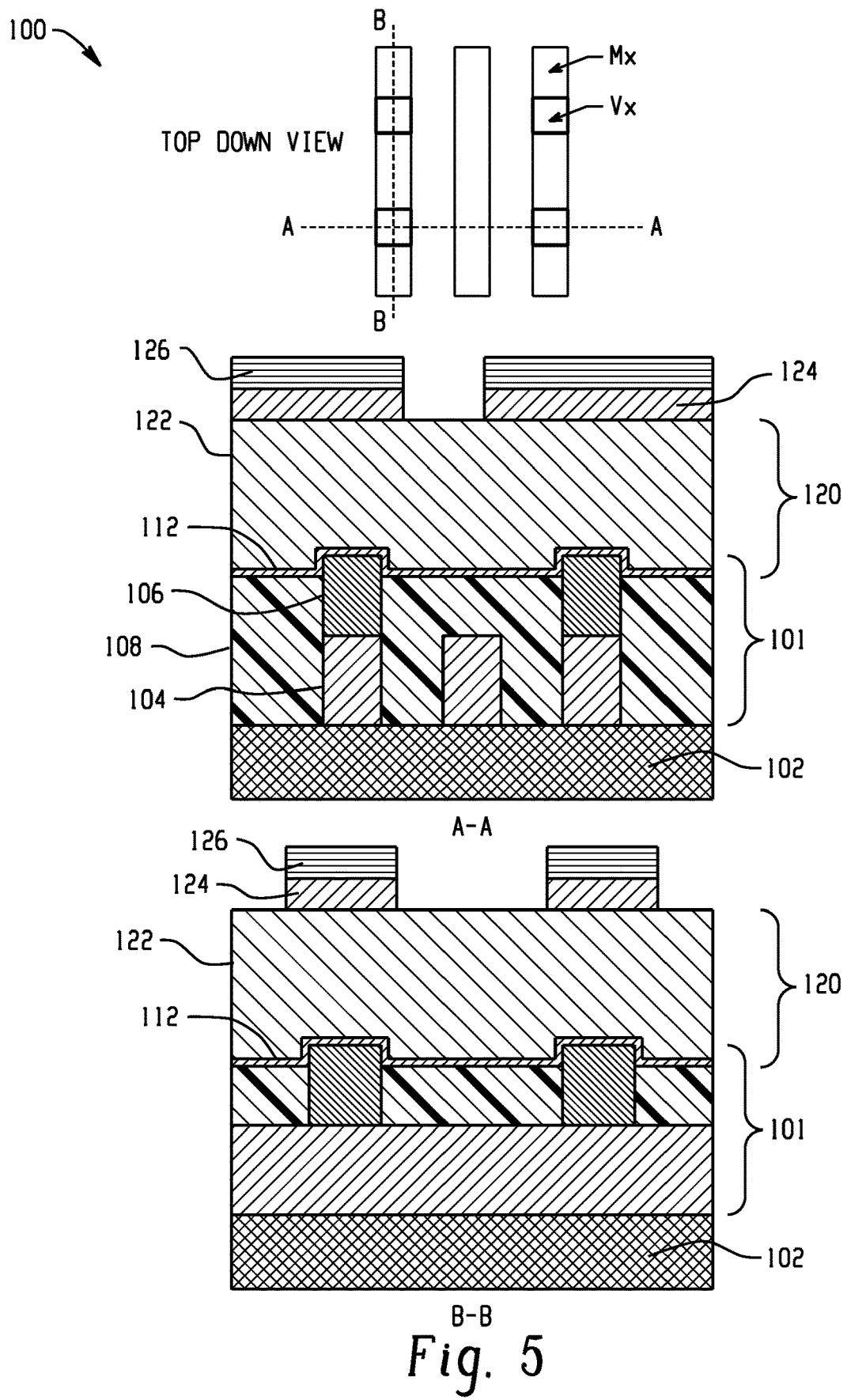
FIG. 5 depicts a top down view and cross-sectional views taken along lines A-A and B-B of the lower metallization level shown in FIG. 4 subsequent to hardmask deposition and patterning in accordance with one or more embodiments of the present invention.

FIG. 5 illustrates top down view and cross-sectional views taken along lines A-A and B-B of the of the metallization level 101 in integrated circuit 100 shown in FIG. 4 subsequent to deposition and patterning of a hardmask 124 on the metal layer 122 and a photoresist layer 126 on the hardmask layer 124. Patterning the hardmask layer 124 and the photoresist layer 126 can include conventional photolithography to pattern the photoresist layer and form a mask followed by transferring the pattern in the photoresist mask by anisotropic etching to form the pattern in the hardmask. The etching process includes a dry etching process (such as, for example, reactive ion etching, ion beam etching, plasma etching or laser ablation), and/or a wet chemical etching process.

The hardmask layer 124 can be formed from nitrides of titanium, tantalum, silicon, combinations thereof, alloys thereof or the like. The metal hardmask layer 124 and the above noted metal etch stop layer 112 can be the same material or different materials. The metal hardmask layer 124 can be formed by CVD, ALD, sputtering, electrochemical deposition or like processes.

Figure 6:
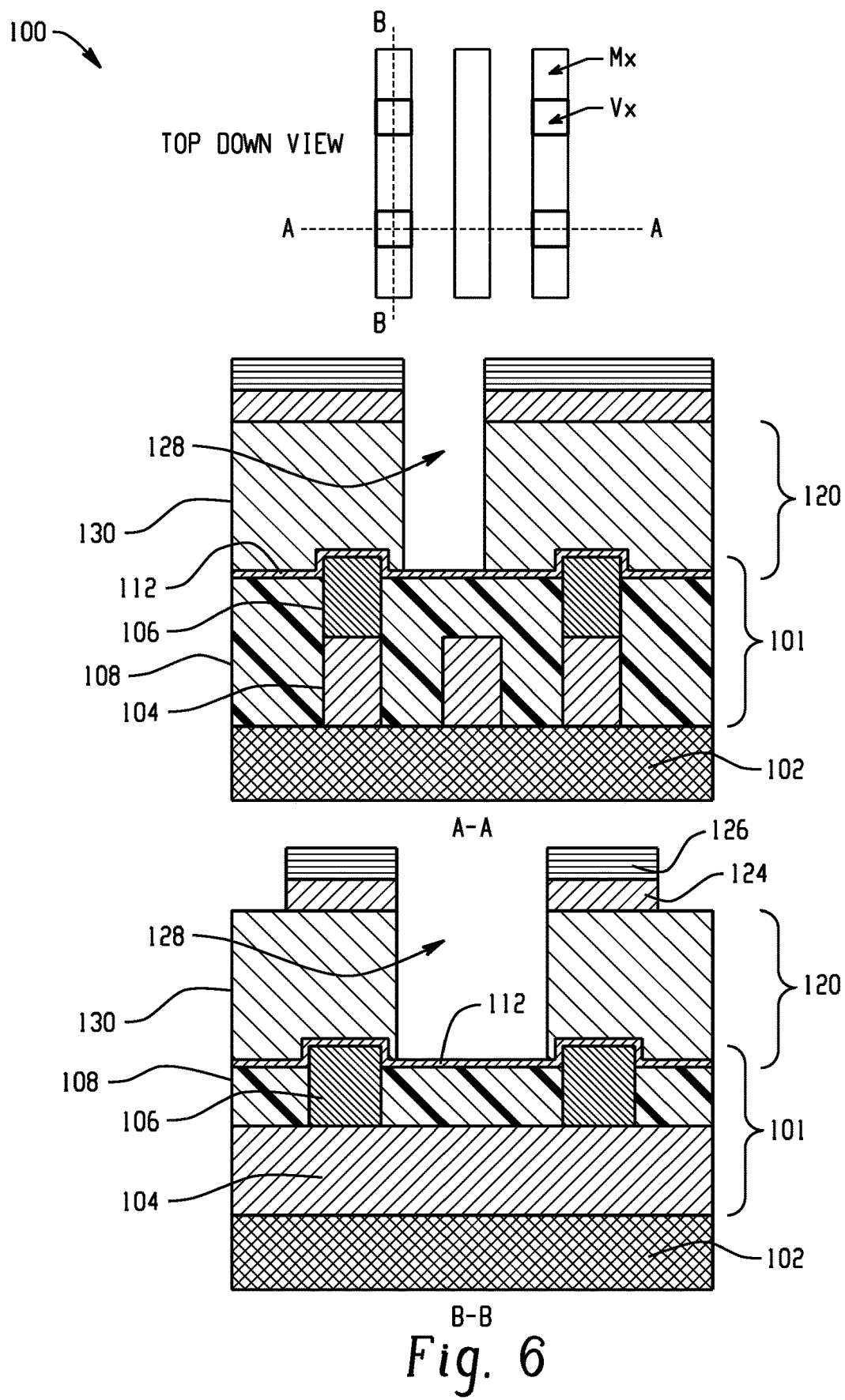
FIG. 6 depicts a top down view and cross-sectional views taken along lines A-A and B-B of the lower metallization level shown in FIG. 5 subsequent to trench patterning of the metal layer in accordance with one or more embodiments of the present invention.

FIG. 6 illustrates top down view and cross-sectional views taken along lines A-A and B-B of the of the metallization level 101 in integrated circuit 100 shown in FIG. 5 subsequent to transferring the pattern defined in the hardmask layer 124 into the metal layer 122 to the etch stop layer 112, i.e., forming trench features 128 so as to subtractively define the metal lines 130 of the upper metallization level 120. It should be apparent that the metal lines are at a thickness that is equal to the combined line and a top via, which will be formed later. As shown in FIG. 6, the trench features 128 need not be perfectly aligned to a metal line 104 (e.g., the center line as depicted) of the metallization layer 101, as the trench features 128 can be formed selective to the etch stop layer 112. In other words, the etch stop layer 112 prevents over etching that could otherwise occur due to partial misalignment of the trench features 128.

Figure 7:
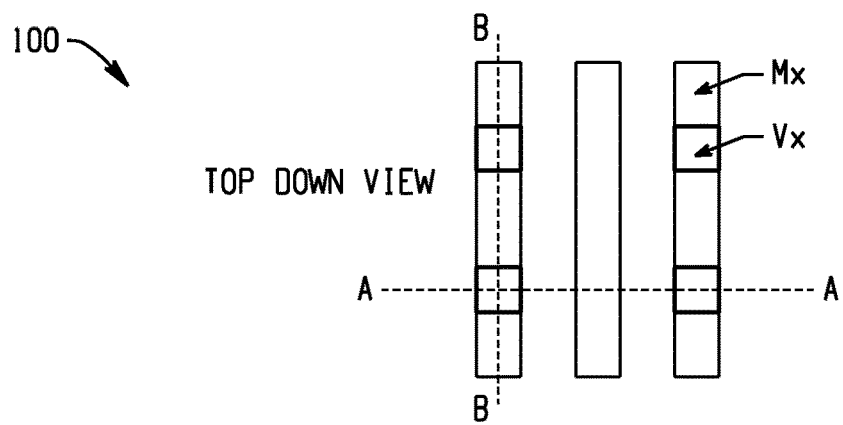
FIG. 7 depicts a top down view and cross-sectional views taken along lines A-A and B-B of the lower metallization level shown in FIG. 6 subsequent to hardmask removal in accordance with one or more embodiments of the present invention.
Figure 7:
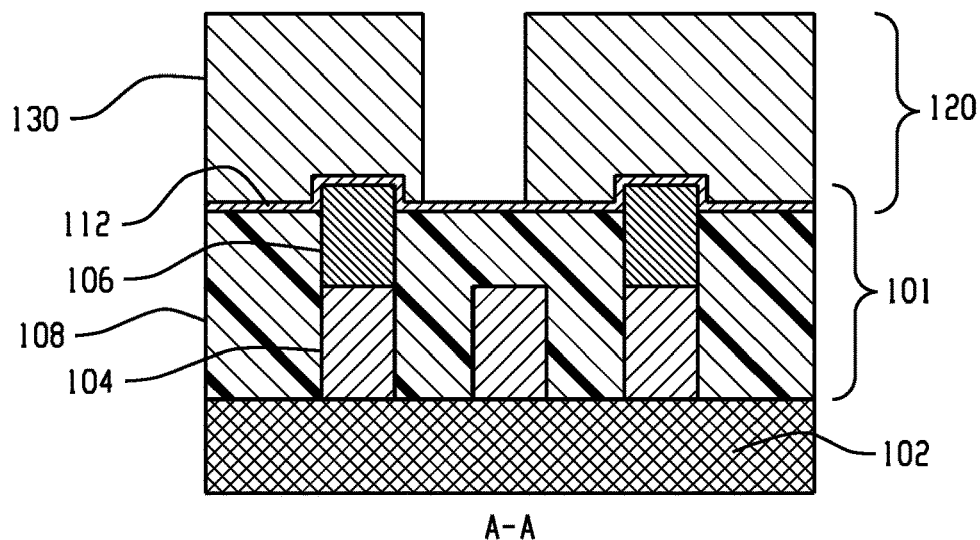
Figure 7:
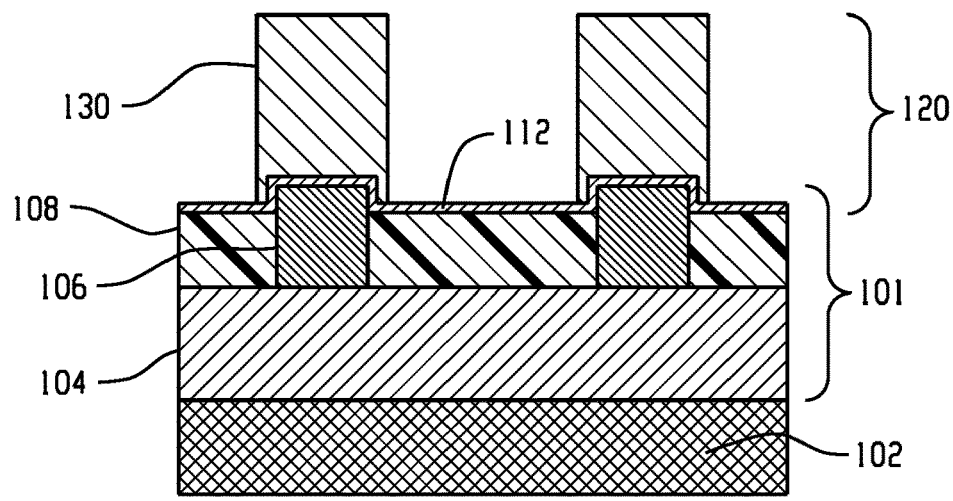

FIG. 7 illustrates top down view and cross-sectional views taken along lines A-A and B-B of the of the metallization level 101 in integrated circuit 100 shown in FIG. 6 subsequent to removal of the hardmask layer 124 and photoresist layer 126 from the subtractively formed metal lines 130 in the upper metallization level 120. Removal can be by a dry etch or wet etch process.

Figure 8:
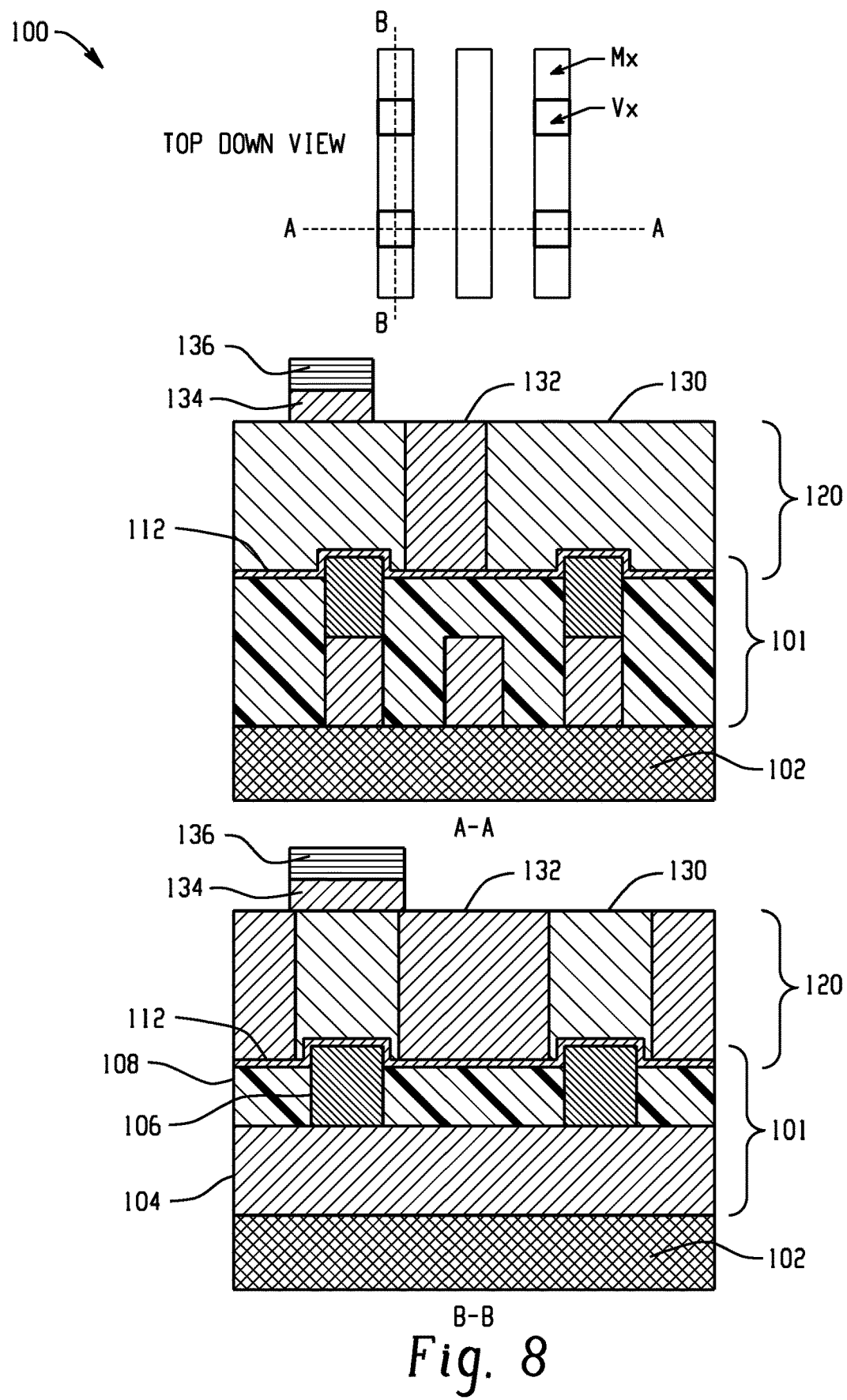
FIG. 8 depicts a top down view and cross-sectional views taken along lines A-A and B-B of the lower metallization level shown in FIG. 7 subsequent to gap fill and via patterning of a hardmask in accordance with one or more embodiments of the present invention.

FIG. 8 illustrates top down view and cross-sectional views taken along lines A-A and B-B of the of the metallization level 101 in integrated circuit 100 shown in FIG. 7 subsequent to gap fill of the trenches between adjacent metal lines 130 with a fill material 132. The fill material 132 is selected to have good gap fill capability and can be a spin on glass, spin on carbon, or the like. Subsequent to filling the trench feature with the gap fill material 132, the structure can be planarized using a chemical mechanical polishing (CMP) process. The CMP process planarizes the surface by a combination of chemical and mechanical forces using a non-selective slurry composition generally known in the art. The slurry composition contains a silica abrasive material, which removes the different materials layers at substantially the same rate. Alternatively, a planar surface can be formed by a non-selective plasma etching process.

A hardmask 134 and photoresist layer 136 can then be deposited and patterned to form a via pattern, i.e., define the locations of the vias fully aligned to the metal lines 130. The hardmask 134 and photoresist layer 136 can be formed of materials previously described. Patterning the hardmask layer 134 and the photoresist layer 136 can include conventional photolithography to pattern the photoresist layer and form a mask followed by transferring the pattern in the photoresist mask by anisotropic etching to form the pattern in the hardmask. The etching process includes a dry etching process (such as, for example, reactive ion etching, ion beam etching, plasma etching or laser ablation), and/or a wet chemical etching process.

Figure 9:
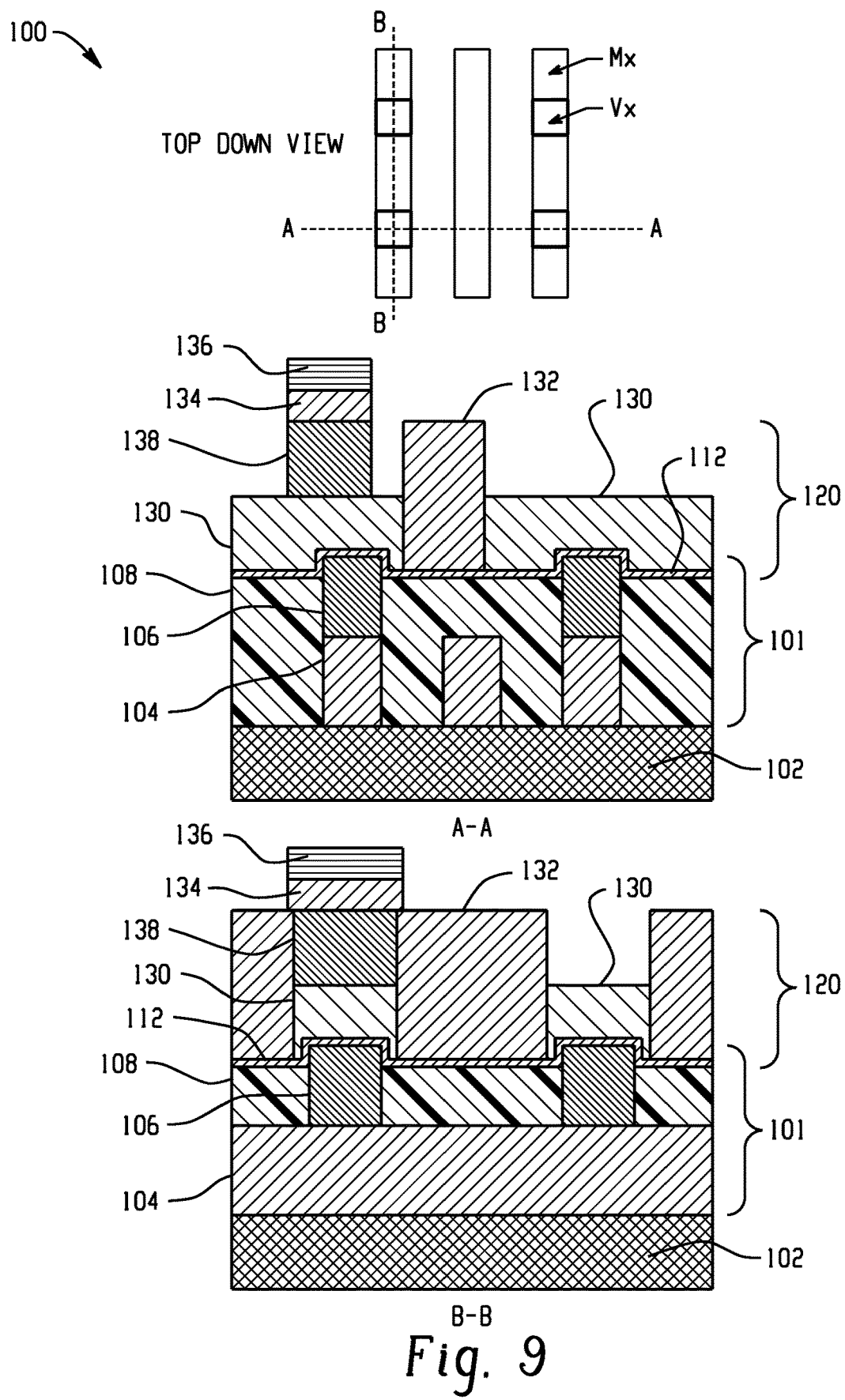
FIG. 9 depicts a top down view and cross-sectional views taken along lines A-A and B-B of the lower metallization level shown in FIG. 8 subsequent to metal via etch of the metal layer in accordance with one or more embodiments of the present invention.

FIG. 9 illustrates top down view and cross-sectional views taken along lines A-A and B-B of the of the metallization level 101 in integrated circuit 100 shown in FIG. 8 subsequent to transferring the via pattern defined in the hardmask layer 134 and photoresist layer 136 into the metal layer 122 to subtractively define fully aligned vias 138 on the metal lines 130 and to provide a desired thickness to the metal lines 130 at locations free of the vias 138.

Figure 10:
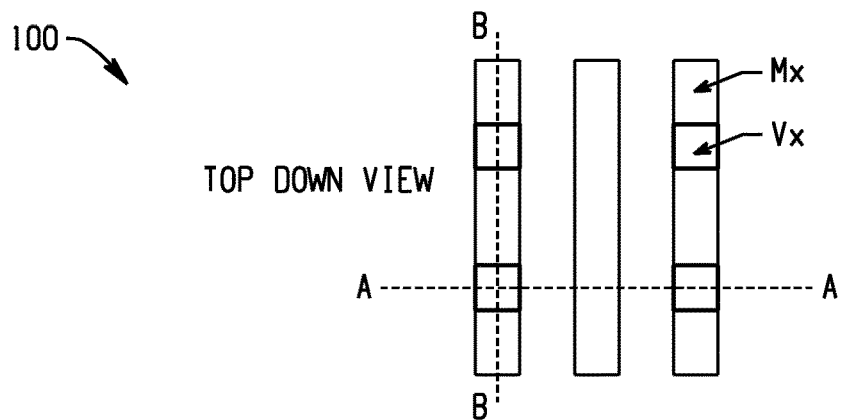
FIG. 10 depicts a top down view and cross-sectional views taken along lines A-A and B-B of the lower metallization level shown in FIG. 9 subsequent to hardmask and gap fill removal in accordance with one or more embodiments of the present invention.
Figure 10:
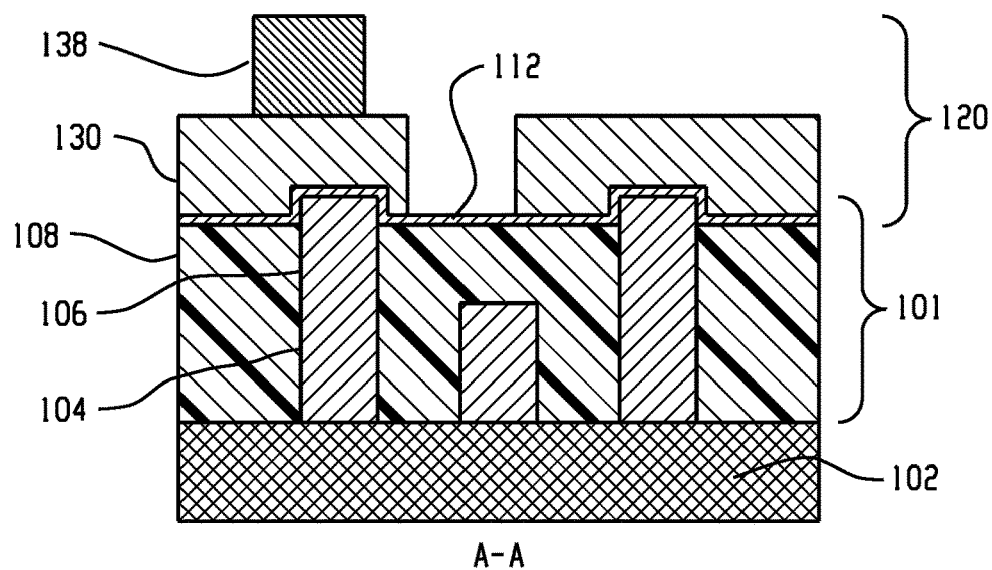
Figure 10:
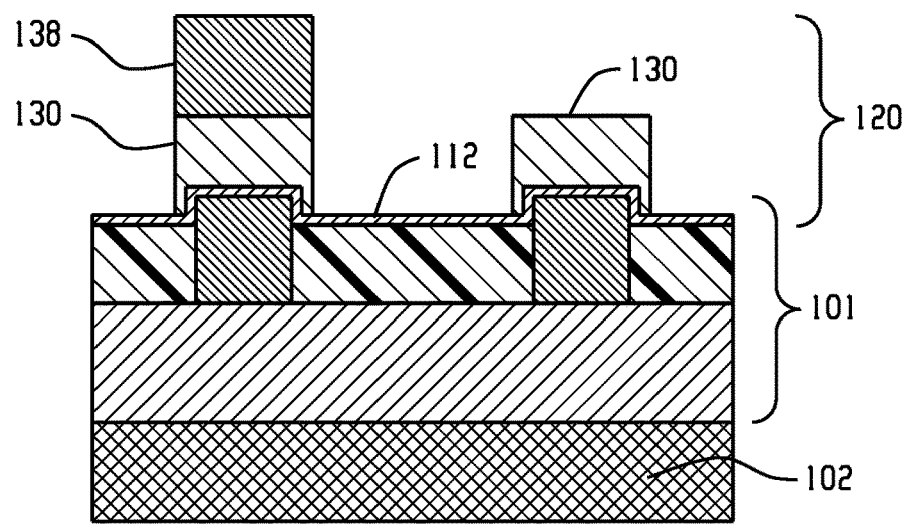

FIG. 10 illustrates top down view and cross-sectional views taken along lines A-A and B-B of the of the metallization level 101 in integrated circuit 100 shown in FIG. 9 subsequent to removal of the photoresist layer 136, hardmask layer 134, and the gap fill material 132 shown in the previous figure to form the top via-line interconnect structure in the upper metallization level 120. A dry or wet etch process can be used to remove the different materials.

Figure 11:
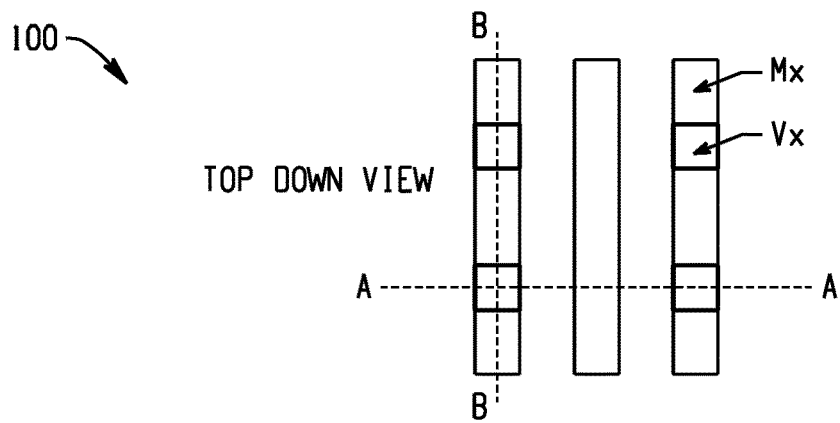
FIG. 11 depicts a top down view and cross-sectional views taken along lines A-A and B-B of the lower metallization level shown in FIG. 10 subsequent to etch stop layer open in accordance with one or more embodiments of the present invention.
Figure 11:
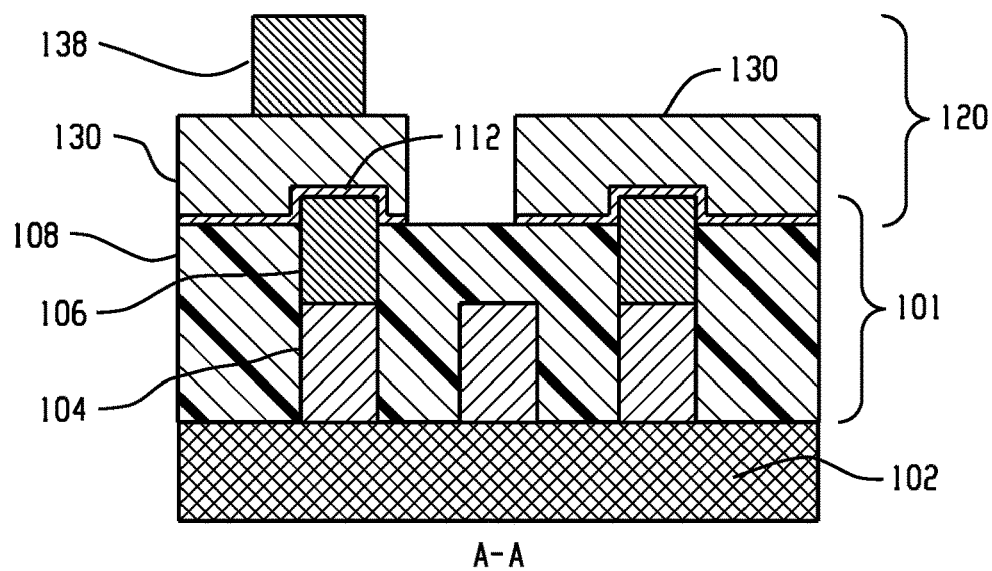
Figure 11:
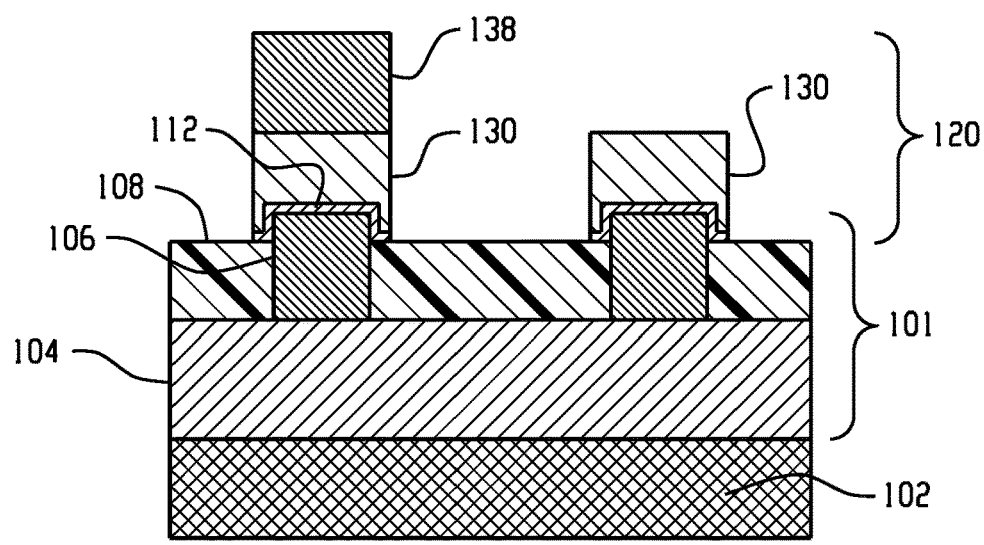

FIG. 11 illustrates top down view and cross-sectional views taken along lines A-A and B-B of the of the metallization level 101 in integrated circuit 100 shown in FIG. 10 subsequent to opening the exposed portions of the etch stop layer 112 so that the remaining portions of the etch stop layer are sandwiched between the metal lines 130 of the top via-line interconnect in the upper metallization level 120 and the metal vias 106 of the top via-line interconnect in metallization level 101. An anisotropic etch process can be used to remove the exposed portions of the etch stop layer 112.

Figure 12:
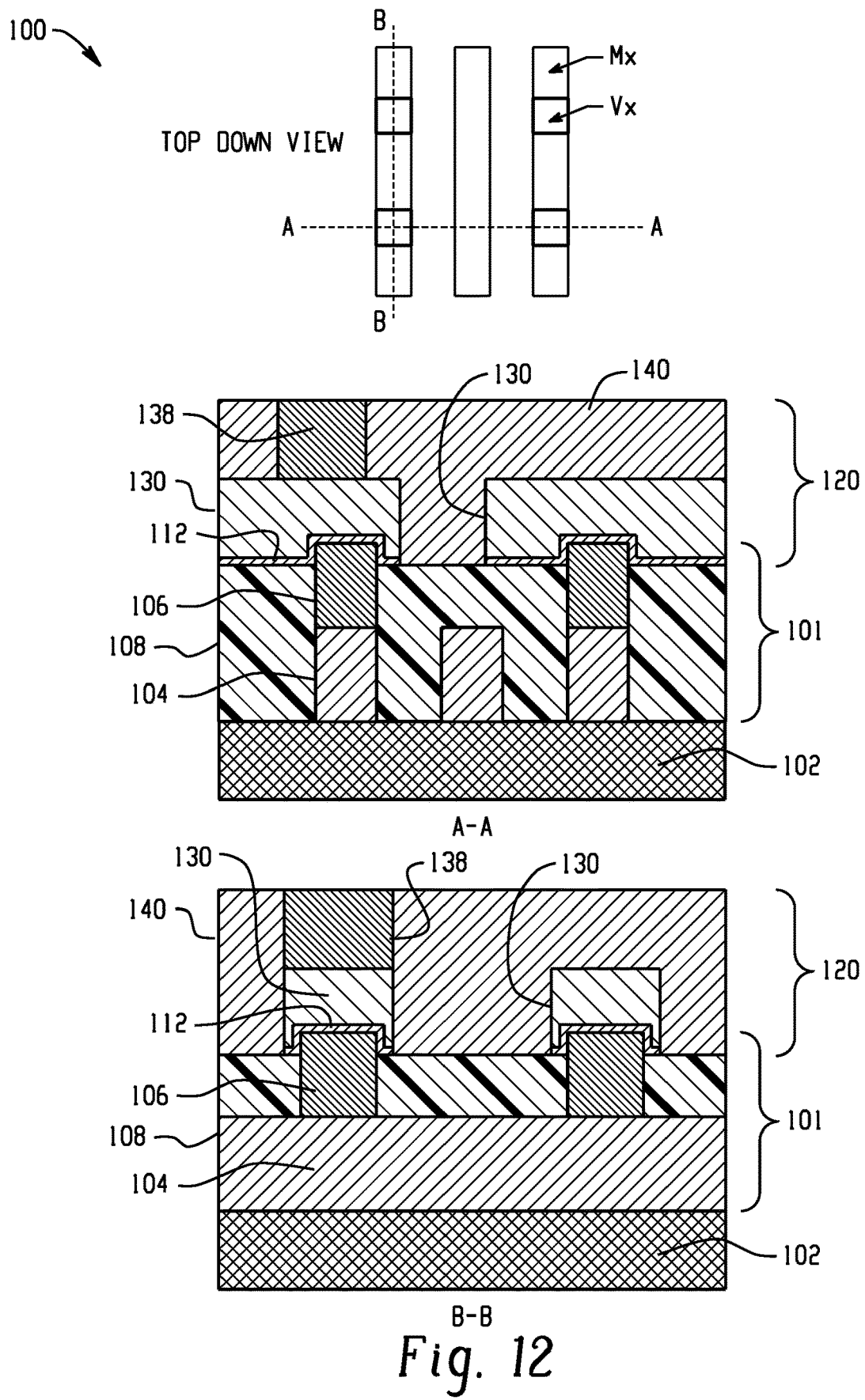
FIG. 12 depicts a top down view and cross-sectional views taken along lines A-A and B-B of the metallization level shown in FIG. 11 subsequent to dielectric fill and planarization to form the upper metallization level on the lower metallization level in accordance with one or more embodiments of the present invention.

FIG. 12 illustrates top down view and cross-sectional views taken along lines A-A and B-B of the of the metallization level 101 in integrated circuit 100 shown in FIG. 11 subsequent to dielectric fill of an interlayer dielectric 140 to complete the top via-line interconnect structure in the upper metallization level 120, which overlays lower metallization level 101. The dielectric material can be a low k dielectric material, which is generally defined as an insulating material having a dielectric constant less than 3.9. Suitable low k dielectrics can include, but are not intended to be limited to, carbon doped oxides, porous materials such as porous silicon dioxide or porous carbon-doped oxides, spin-on polymer dielectric, spin-on silicon based polymeric dielectrics such as silsesquioxanes, air gaps, fluorine doped silicon dioxide and the like.

As shown more clearly in the cross-sectional view of the metallization level 101 taken along lines B-B, the metal vias 106 in the lower metallization level 101 project into the metal lines 130 of metallization level 120, which results in increased surface area for the connection between the interconnect levels 101 and 120. In other words, a topmost surface of the metal vias 106 projects into the upper metallization level 120 above a bottommost surface of the metal lines 130. Advantageously, the increased surface area lowers the resistivity between the metal vias 106 of lower metallization level 101 and the line in upper metallization level 120. Further reductions in resistance can be obtained by the use of metals alternative to copper and tungsten such as, for example, ruthenium.

The descriptions of the various embodiments of the present invention have been presented for purposes of illustration but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A method of forming an upper metallization level on a lower metallization level having an enlarged contact area between a line in the upper metallization level and a top via in the lower metallization level, the method comprising:
   providing the lower metallization level having a planar surface comprising a top via-line interconnect structure in a first interlayer dielectric;
   recessing the first interlayer dielectric to provide a raised portion of the top via relative to the first interlayer dielectric;
   conformally depositing an etch stop layer onto the lower metallization level;
   forming the upper metallization level comprising depositing a metal layer onto the etch stop layer;
   patterning trenches in the metal layer to the etch stop layer;
   filling the trenches with a gap fill material;
   subtractively etching the metal layer to pattern vias and define a second top via-line interconnect structure;
   removing the gap fill material to the etch stop layer;
   removing exposed portions of the etch stop layer; and
   depositing a second interlayer dielectric to define the upper metallization level on the lower metallization level;
   wherein a topmost surface of the top via projects into the upper metallization level above a bottommost surface of the line.

2. The method of claim 1, wherein the metal layer comprises a first metal layer, a second metal layer, and a second etch stop layer intermediate the first and second metal layers, wherein the first metal layer defines a height of the line and the second layer defines a height of the via in the top-via line interconnect structure defined in the upper metallization level.

3. The method of claim 1, wherein patterning the trenches in the metal layer to the etch stop layer comprises depositing a hardmask layer onto the metal layer; depositing a photoresist layer on the hardmask layer; patterning the photoresist layer; transferring the pattern to the hardmask layer to form a mask; and directionally etching the metal layer to form the trenches.

4. The method of claim 1, wherein the gap fill material comprises a spin-on carbon or a spin-on glass.

5. The method of claim 1, wherein the top via-line interconnect structures in the upper and lower metallization levels comprise copper, tungsten, ruthenium, iridium, rhodium, platinum, molybdenum, cobalt, aluminum, nickel, combinations thereof, or alloys thereof.

6. The method of claim 1, wherein the interlayer dielectric in the lower and/or upper metallization levels comprise a low k dielectric material.

7. The method of claim 1, wherein the etch stop layer comprises titanium, cobalt, tantalum, rhodium, tungsten, iridium, combinations thereof, or alloys thereof.

\* \* \* \* \*